United States Patent
Pudi et al.

(10) Patent No.: US 11,327,515 B1
(45) Date of Patent: May 10, 2022

(54) LOCAL CONFIGURATION USING PROGRAMMABLE HEADER SWITCH

(71) Applicant: QUALCOMM Incorporated, San Diego, CA (US)

(72) Inventors: Bapana Naidu Pudi, Bangalore (IN); Bharat Kavala, Visakhapatnam (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/218,515

(22) Filed: Mar. 31, 2021

(51) Int. Cl.
*G05F 1/56* (2006.01)
*H03K 3/037* (2006.01)

(52) U.S. Cl.
CPC ............... *G05F 1/56* (2013.01); *H03K 3/037* (2013.01)

(58) Field of Classification Search
None
See application file for complete search history.

(56) References Cited

U.S. PATENT DOCUMENTS

| | | | | |
|---|---|---|---|---|
| 8,327,163 B2 * | 12/2012 | Chen | ........................ | G06F 1/26 713/300 |
| 8,421,499 B2 * | 4/2013 | Takayanagi | ........ | H03K 19/0016 326/33 |
| 8,519,772 B2 * | 8/2013 | Chu | .................... | H03K 19/0016 327/434 |
| 9,564,898 B2 * | 2/2017 | Suzuki | ............. | H03K 19/00361 |
| 9,852,859 B2 * | 12/2017 | Cao | .................... | H03K 19/0008 |
| 2015/0082070 A1 * | 3/2015 | Bose | ..................... | G06F 1/3287 713/324 |

* cited by examiner

*Primary Examiner* — Thomas J. Hiltunen
(74) *Attorney, Agent, or Firm* — Patterson+ Sheridan, L.L.P.

(57) ABSTRACT

Certain aspects of the present disclosure generally relate to optimizing, or at least reducing, power consumption and/or hold timing issues within an integrated circuit (IC). One example IC generally includes a global power supply rail and a first power block. The first power block includes a first plurality of head switch cells coupled to the global power supply rail. Each head switch cell includes a head switch coupled between the global power supply rail and a power node for the head switch cell. The first plurality of head switch cells is configured such that a first set of the first plurality of head switch cells can be programmed on and a second set of the first plurality of head switch cells can be programmed off.

18 Claims, 5 Drawing Sheets

400

402

SELECTIVELY PROGRAM A FIRST PLURALITY OF HEAD SWITCH CELLS IN A FIRST POWER BLOCK AND COUPLED TO A GLOBAL POWER SUPPLY RAIL, SUCH THAT A FIRST SET OF THE FIRST PLURALITY OF HEAD SWITCH CELLS IS PROGRAMMED ON AND A SECOND SET OF THE FIRST PLURALITY OF HEAD SWITCH CELLS IS PROGRAMMED OFF, WHEREIN EACH HEAD SWITCH CELL COMPRISES A HEAD SWITCH COUPLED BETWEEN THE GLOBAL POWER SUPPLY RAIL AND A POWER NODE FOR THE HEAD SWITCH CELL

404

SELECTIVELY PROGRAM THE FIRST PLURALITY OF HEAD SWITCH CELLS SUCH THAT A THIRD SET OF THE FIRST PLURALITY OF HEAD SWITCH CELLS IS PROGRAMMED ON AND A FOURTH SET OF THE SECOND PLURALITY OF HEAD SWITCH CELLS IS PROGRAMMED OFF, WHEREIN THE THIRD SET IS DIFFERENT FROM THE FIRST SET AND WHEREIN THE FOURTH SET IS DIFFERENT FROM THE SECOND SET

406

SELECTIVELY PROGRAM A SECOND PLURALITY OF HEAD SWITCH CELLS IN A SECOND POWER BLOCK AND COUPLED TO THE GLOBAL POWER SUPPLY RAIL, SUCH THAT A FIRST SET OF THE SECOND PLURALITY OF HEAD SWITCH CELLS IS PROGRAMMED ON AND A SECOND SET OF THE SECOND PLURALITY OF HEAD SWITCH CELLS IS PROGRAMMED OFF, WHEREIN EACH HEAD SWITCH CELL IN THE SECOND PLURALITY OF HEAD SWITCH CELLS COMPRISES A HEAD SWITCH COUPLED BETWEEN THE GLOBAL POWER SUPPLY RAIL AND A POWER NODE FOR THE HEAD SWITCH CELL

FIG. 4

LOCAL CONFIGURATION USING PROGRAMMABLE HEADER SWITCH

TECHNICAL FIELD

Certain aspects of the present disclosure generally relate to electronic circuits and, more particularly, to individually programmable distributed head switch cells.

BACKGROUND

Power management integrated circuits (power management ICs or PMICs) are used for managing the power requirement of a host system and may include and/or control one or more voltage regulators. A PMIC may be used in battery-operated devices, such as mobile phones, tablets, laptops, wearables, etc., to control the flow and direction of electrical power in the devices. The PMIC may perform a variety of functions for the device such as DC-to-DC conversion, battery charging, power-source selection, voltage scaling, power sequencing, etc.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure provide an electronic circuit. The circuit generally includes a global power supply rail and a first power block. The first power block includes a first plurality of head switch cells coupled to the global power supply rail. Each head switch cell includes a head switch coupled between the global power supply rail and a power node for the head switch cell. The first plurality of head switch cells is configured such that a first set of the first plurality of head switch cells can be programmed on and a second set of the first plurality of head switch cells can be programmed off.

Certain aspects of the present disclosure are directed to a method of local power control. The method generally includes selectively programming a first plurality of head switch cells in a first power block and coupled to a global power supply rail such that a first set of the first plurality of head switch cells is programmed on and a second set of the first plurality of head switch cells is programmed off, wherein each head switch cell comprises a head switch coupled between the global power supply rail and a power node for the head switch cell.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 4 is a flow diagram of example operations for locally controlling power in an integrated circuit, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
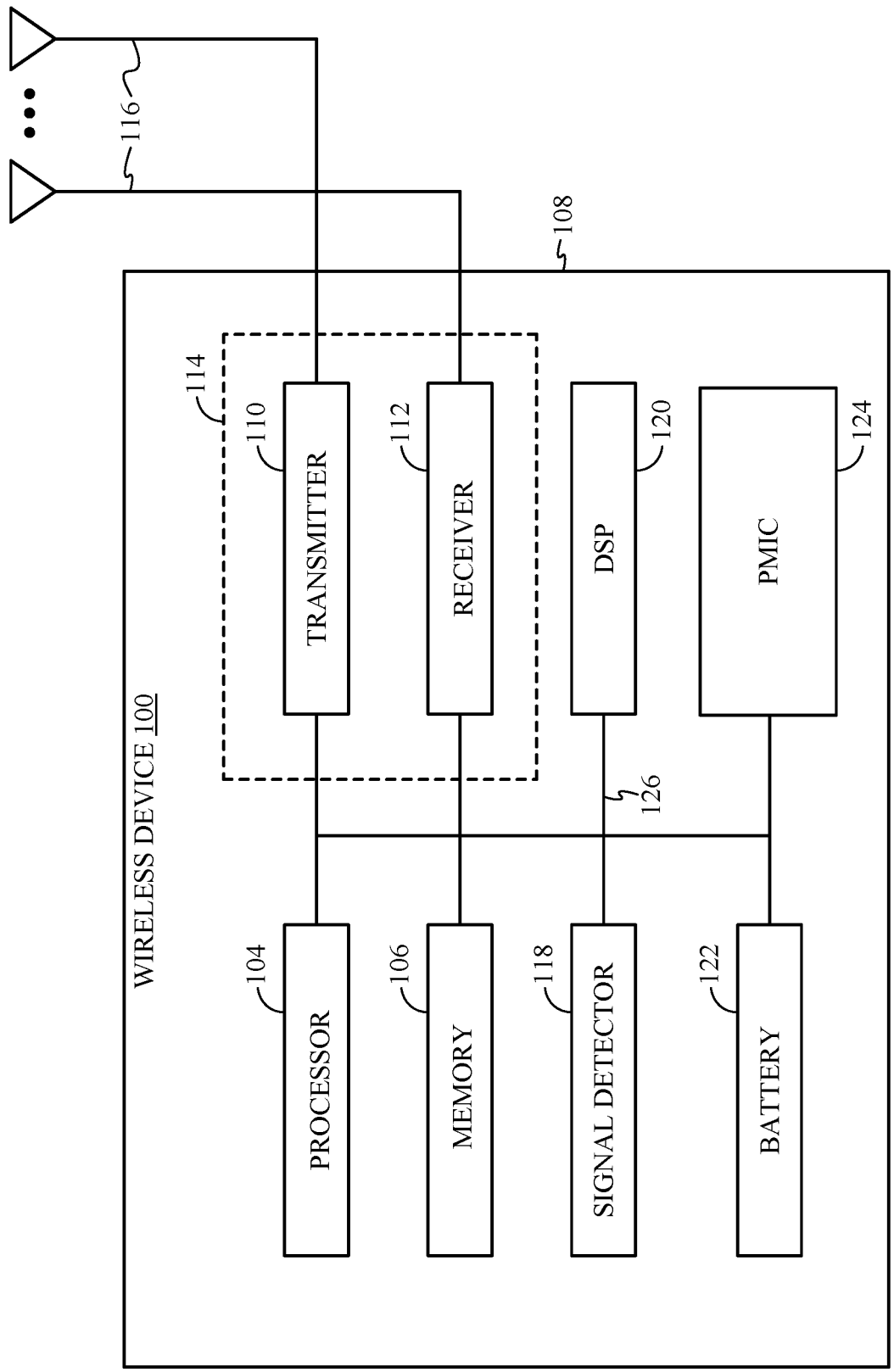
FIG. 1 is a block diagram of an example device comprising a power management integrated circuit (PMIC), in which certain aspects of the present disclosure may be practiced.

Certain aspects of the present disclosure provide techniques and apparatus for reducing power consumption and/or hold timing issues within one or more power blocks of an integrated circuit (IC). For example, an IC can include one or more power blocks (also referred to as "(hard) macros"), each of which can be powered down independently of one another to reduce power consumption. In some aspects described herein, a power block can include one or more individually programmable head switch cells (also referred to as "header switch cells"), which can be dynamically turned on and off within the power block.

In one aspect, for example, one or more programmable head switch cells within a power block can be dynamically turned off to power down one or more regions of the power block independently of one or more other regions of the power block. By using programmable head switch cell(s) to power down certain regions of a power block, aspects can significantly reduce power consumption of the IC in certain operating modes, relative to conventional power block implementations. Additionally or alternatively, by using programmable head switch cell(s) to power down certain regions of a power block, aspects can increase the delay of the data path in those regions, which in turn can mitigate the hold failure in the regions.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

It should be understood that aspects of the present disclosure may be used in a variety of applications. Although the present disclosure is not limited in this respect, the circuits disclosed herein may be used in any of various suitable apparatus, such as in the power supply, battery charging circuit, or power management circuit of a communication system, a video codec, audio equipment such as music players and microphones, a television, camera equipment, and test equipment such as an oscilloscope.

Communication systems intended to be included within the scope of the present disclosure include, by way of example only, cellular radiotelephone communication systems, satellite communication systems, two-way radio communication systems, one-way pagers, two-way pagers, personal communication systems (PCS), personal digital assistants (PDAs), and the like.

Example Device

FIG. 1 illustrates an example device 100 in which aspects of the present disclosure may be implemented. The device 100 may be a battery-operated device such as a cellular phone, a PDA, a handheld device, a wireless device, a laptop computer, a tablet, a smartphone, a wearable device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as DC-to-DC conversion, battery charging, power-source selection, voltage scaling, power sequencing, etc. In certain aspects, the PMIC 124 is configured as a voltage source to supply voltages to power rails at specified voltage levels through voltage conversion or regulation. In some aspects described in more detail below, the PMIC 124 can be configured to dynamically turn on and off one or more individual head switch cells within a power block of an IC in the device 100.

The various components of the device 100 may be coupled together by a bus system 126, which may include a power bus, a control signal bus, and/or a status signal bus in addition to a data bus.

Figure 2:
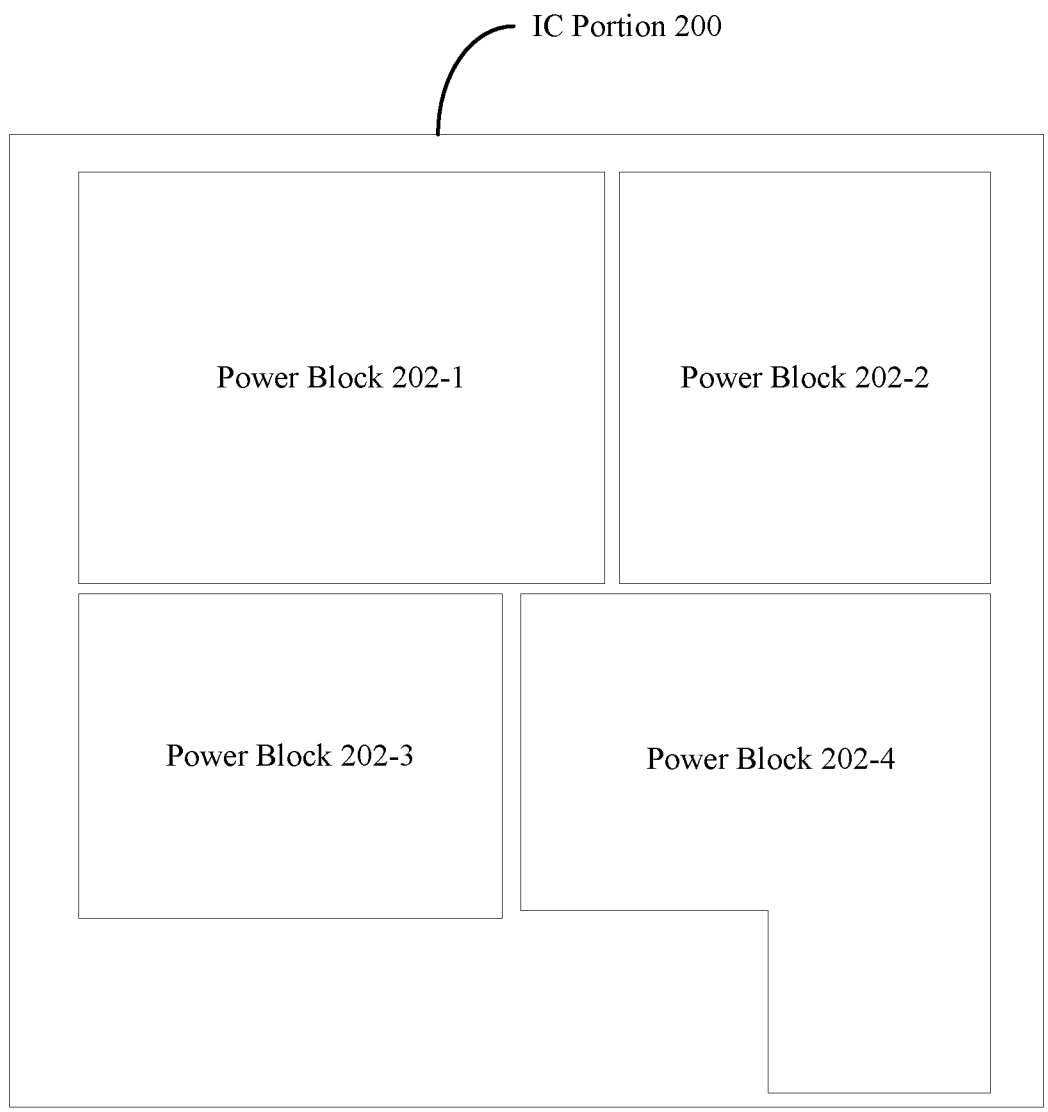
FIG. 2 illustrates an example integrated circuit with multiple power blocks, in which certain aspects of the present disclosure may be practiced.

FIG. 2 depicts an example IC portion 200 with multiple power blocks 202-1 to 202-4. Note that while the IC portion 200 is shown with four power blocks, the IC portion 200 can include any number of power blocks. The IC portion 200 may be representative of a single power domain (out of one or more power domains) within the entire IC. Each power block 202 is a hierarchical block that may be optimized or otherwise designed for at least one of power, area, or timing.

In some aspects, for a given mode of operation, a PMIC (e.g., PMIC 124) can set the PMIC voltage of the IC portion 200 to a minimum voltage (VMIN) to achieve a specified performance at a minimum power consumption (which may be referred to as "rock bottom power consumption"). The VMIN setting may be global for the power blocks (e.g., power blocks 202-1 to 202-4) within a given power domain. However, while the VMIN setting may be global for a given power domain, in some cases, the VMIN setting may be based on (i) a subset of the power blocks in the power domain and/or (ii) a subset of the regions within a power block. Consider, for example, a scenario in which the power blocks 202-1 to 202-4 are powered by a single power domain VDDCX. In some cases, depending on the mode of operation, a critical power block, such as power block 202-1, may have to operate at a higher voltage than the other power blocks 202-2 to 202-4. However, because power block 202-1 has to operate at this higher voltage, the rest of power blocks 202-2 to 202-4 may also have to operate at the same higher voltage in some cases, even though power blocks 202-2 to 202-4 may be able to meet the desired performance at a lower voltage.

Figure 3A:
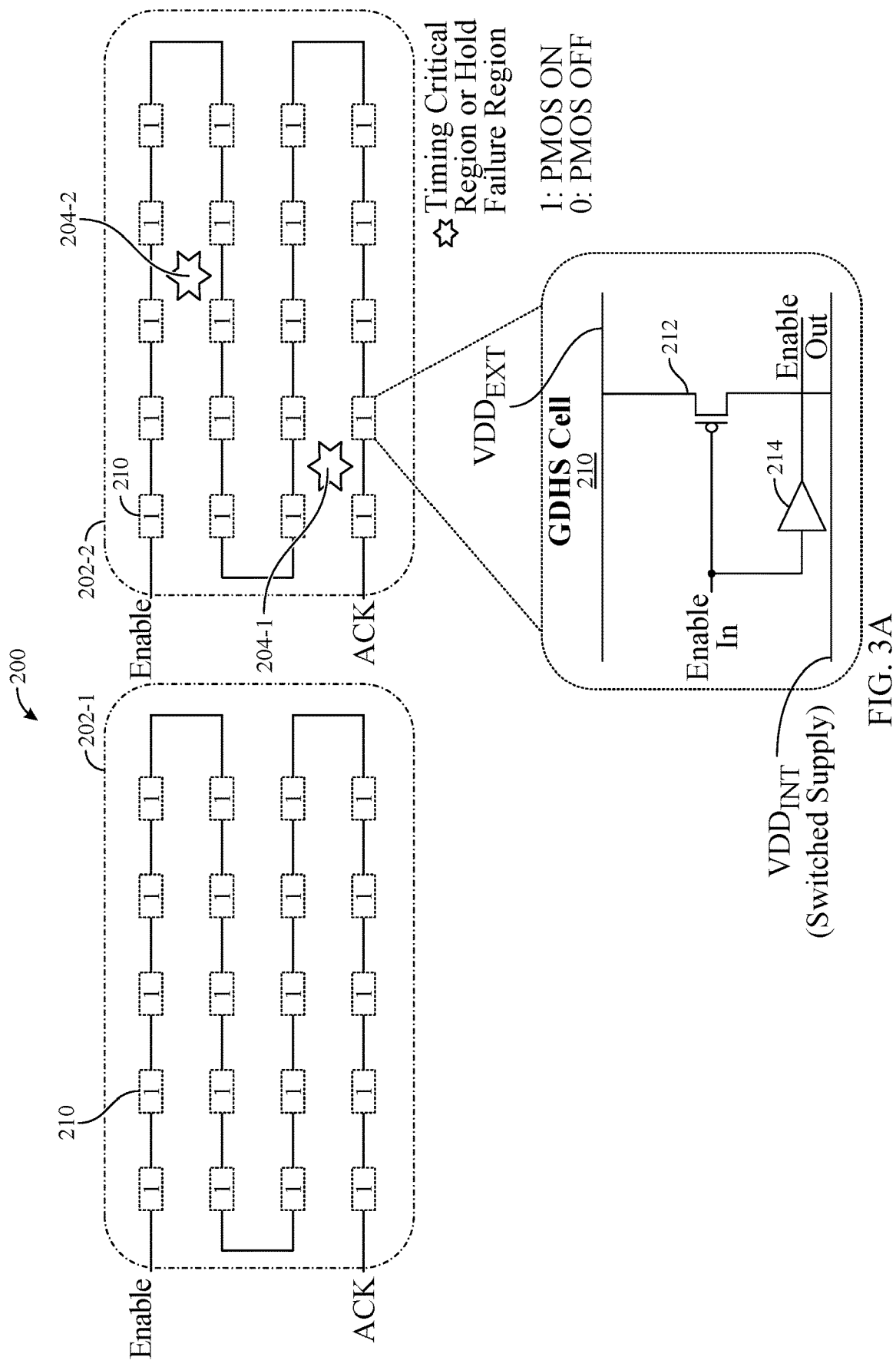
FIG. 3A illustrates an example implementation of a global distributed head switch cell within multiple power blocks of an integrated circuit, in accordance with certain aspects of the present disclosure.

In some cases, the PMIC can power on or power off a power block 202 independently from other power blocks 202, in order to reduce power consumption, for example. FIG. 3A illustrates an example implementation of global distributed head switch (GDHS) cells (also referred to as "head switch cells") within power block 202-1 and power block 202-2. Here, power block 202-1 may be a non-VMIN-setting power block (e.g., VMIN is not based on operation of the power block), whereas power block 202-2 may be a VMIN-setting power block (e.g., VMIN is based on operation of the power block). In other words, power block 202-2 is a critical block for deciding VMIN in this example implementation. Power block 202-2 may be a critical block due in part to critical regions 204-1 and 204-2 within the power block 202-2. The critical regions 204-1 and 204-2, for example, may be timing critical regions in which a higher supply voltage is used in order to meet a desired performance.

Each power block 202-1 and 202-2 includes a chain of GDHS cells 210. As shown, each GDHS cell 210 includes a head switch 212 coupled between $VDD_{EXT}$ (e.g., a global power supply rail, set to VMIN) and $VDD_{INT}$ (an internal power node for or associated with the GDHS cell, such as a switched power supply rail). The GDHS cell 210 also includes an Enable input (labeled "ENABLE IN"), an Enable output (labeled "ENABLE OUT"), and a logic gate 214 (e.g., a logic buffer) coupled between the Enable input and the Enable output. As shown, in some cases, the head switch 212 may be implemented as a p-type field-effect transistor (PFET) having (i) a gate coupled to the Enable input, (ii) a source coupled to $VDD_{EXT}$, and (iii) a drain coupled to $VDD_{INT}$. In this case, when the Enable input is logic high, the PFET head switch is off, whereas when the Enable input is logic low, the PFET head switch is on.

In this implementation, the GDHS cells 210 within a power block are controlled collectively based on a single Enable input to the power block. For example, based on the Enable input to a given power block, all of the GDHS cells 210 within the power block can be programmed off or on. As shown, all of the GDHS cells 210 within power block 202-1 (e.g., a non-VMIN-setting power block) are turned on, and all of the GDHS cells 210 within power block 202-2 (e.g., a VMIN-setting power block) are turned on (where "1" indicates that the GDHS cell is on and where "0" indicates that the GDHS cell is off; in other words, the "1" in FIG. 3A does not indicate logic high).

As noted, when a power block is not in use, the head switch cells can be used to turn the power block off, e.g., to save power. In some cases, however, when a non-VMIN-setting power block is in functional mode, it may not be possible with conventional techniques to optimize, or at least reduce, the power consumption because the external power supply (e.g., VDDCX) is global to all of the power blocks associated with a power domain. In FIG. 3A, for example, power block 202-1 operates at the same elevated voltage as power block 202-2, even though VMIN is set based on power block 202-2.

Additionally, in cases where the critical regions 204-1 and/or 204-2 within power block 202-2 are hold failure regions (e.g., regions of the IC susceptible to hold failures of the data path), it may not be possible with conventional techniques to mitigate hold failures that occur within these regions without significantly impacting performance. For example, one technique for reducing hold failures can involve lowering the supply voltage from the PMIC (e.g., PMIC 124). The lower supply voltage can delay the data path, so that data is not captured at the same clock edge. However, lowering the supply voltage with the implementation of FIG. 3A can impact (e.g., reduce) performance of the entire power block.

Accordingly, it may be desirable to provide a circuit design that allows for localized (or individual) head switch control within a power block, e.g., in order to optimize, or at least decrease, the power consumption within the power block and/or mitigate hold failures within the power block.

Example Individually Programmable GDHS Cells

Figure 3B:
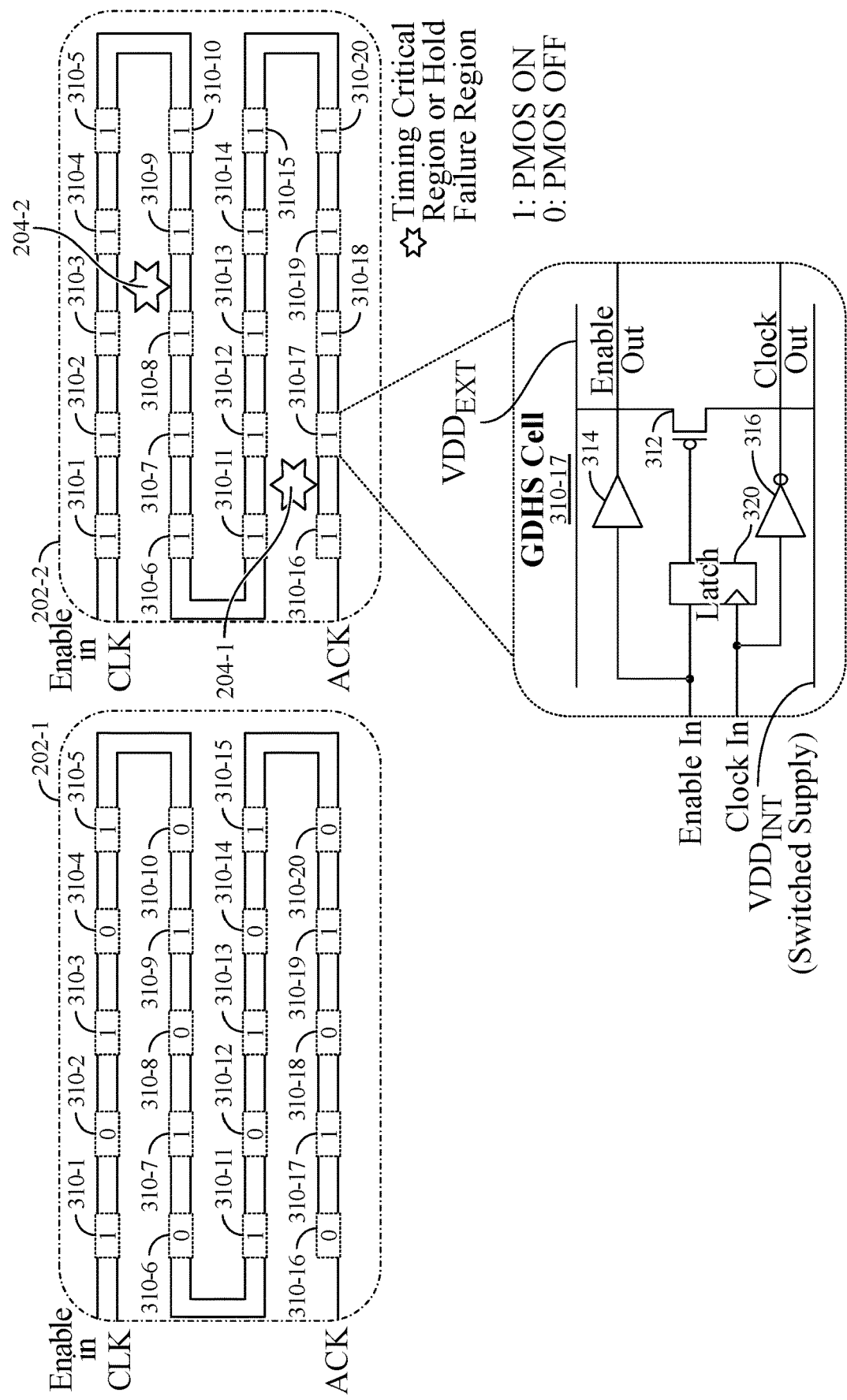
FIG. 3B illustrates an example implementation of an individually programmable global distributed head switch cell within multiple power blocks of an integrated circuit, in accordance with certain aspects of the present disclosure.

FIG. 3B illustrates an example implementation of GDHS cells within power block 202-1 and power block 202-2 that can be individually controlled (e.g., separately programmed), according to certain aspects of the present disclosure. Each power block 202-1 and 202-2 includes a chain of GDHS cells 310. Although power blocks 202-1 and 202-2 are illustrated as including the same number of GDHS cells 310 (namely 20), power block 202-2 may include more or less than the number of GDHS cells in power block 202-1.

Each GDHS cell 310 includes a head switch 312 that is coupled between the $VDD_{EXT}$ (e.g., a global power supply rail, such as VMIN) and $VDD_{INT}$ (e.g., a switched power supply). The GDHS cell 310 also includes an Enable input (labeled "ENABLE IN"), a clock input (labeled "CLOCK IN"), a clock output (labeled "CLOCK OUT"), an Enable output (labeled "ENABLE OUT"), a flip-flop 320, a logic gate 314, and a logic gate 316. As shown, in some cases, the head switch 312 may be implemented as a PFET having (i) a gate coupled to the output of the flip-flop 320, (ii) a source coupled to $VDD_{EXT}$, and (iii) a drain coupled to $VDD_{INT}$.

The flip-flop 320 may be implemented as a delay (D) flip-flop. The flip-flop 320 includes (i) a data input coupled to the Enable input and (ii) a clock input coupled to the clock input of the GDHS cell 310. The logic gate 314 (e.g., a logic buffer as shown) is coupled between the Enable input and the Enable output. The logic gate 316 (e.g., a logic inverter as depicted) is coupled between the clock input of the GDHS cell 310 and the clock output of the GDHS cell 310. The flip-flop 320 may allow for individually turning the head switch 312 on and off.

In each power block 202, the outputs of a given GDHS cell 310 may be coupled to the inputs of another GDHS cell 310. Referring to power block 202-1, for example, (i) the Enable output of GDHS cell 310-1 is coupled to the Enable input of GDHS cell 310-2, and the clock output of GDHS cell 310-1 is coupled to the clock input of GDHS cell 310-2; (ii) the Enable output of GDHS cell 310-2 is coupled to the Enable input of GDHS cell 310-3, and the clock output of GDHS cell 310-2 is coupled to the clock input of GDHS cell 310-3; and (iii) so on.

In some aspects, the chain of GDHS cells 310 in each power block 202 forms a sequence register (e.g., similar to a design for testing (DFT) scan chain) that can be programmed with a desired pattern, e.g., to dynamically turn on/off individual GDHS cells 310 in the power block. In this manner, the chain of GDHS cells 310 may be sequentially programmed, where each GDHS cell is selectively programmed. As shown in FIG. 3B, for example, since power block 202-2 is a VMIN-setting power block, each of the GDHS cells 310 in power block 202-2 is programmed to an "on" state (as represented by the "1" in all the GDHS cells). As also shown in FIG. 3B, since power block 202-1 is a non-VMIN-setting power block, a first subset of the GDHS cells (e.g., GDHS cells 310-2, 310-4, 310-6, 310-8, 310-10, 310-12, 310-14, 310-16, 310-18, and 310-20) are programmed to an "off" state (as represented by the "0" in these GDHS cells), and a second subset of the GDHS cells (e.g., GDHS cells 310-1, 310-3, 310-5, 310-7, 310-9, 310-11, 310-13, 310-15, 310-17, and 310-19) are programmed to an "on" state, e.g., to optimize, or at least reduce, power consumption for the power block 202-1.

By selectively programming one or more individual GDHS cells in the non-VMIN-setting power block to the "off" state, aspects can enable the non-VMIN-setting power block to operate at a lower voltage than the VMIN-setting power block, even though the VMIN-setting power block and the non-VMIN-setting power block are connected to the same global power supply rail. In this manner, aspects can significantly reduce power consumption within non-VMIN-setting power blocks, relative to conventional techniques.

Additionally or alternatively, in some aspects, the individually programmable header switch cell design described herein can be used to mitigate hold failures within one or more regions of a power block. In some aspects, the GDHS cells that are within (or near) the critical regions (e.g., hold failure regions) of a power block can be programmed to an "off" state, e.g., to mitigate hold failures in the critical regions. Using FIG. 3B as a reference example, GDHS cell 310-16 (of power block 202-2) can be programmed to the "off" state to mitigate hold failures in critical region 204-1, and GDHS cell 310-8 (of power block 202-2) can be programmed to the "off" state to mitigate hold failures in critical region 204-2. In some aspects, by turning the GDHS cells 310-16 and 310-8 off in critical regions 204-1 and 204-2, respectively, aspects can increase the timing delay of the GDHS cells 310-16 and 310-8. This, in turn, allows for mitigating hold failures while maintaining the performance of the power block, since the global power supply rail is not impacted.

Example Local Power Control Operations

FIG. 4 is a flow diagram of example operations 400 for controlling power locally in an IC, in accordance with certain aspects of the present disclosure. The operations 400 may be performed by a circuit, such as a PMIC. The operations 400 begin, at block 402, by selectively programming a first plurality of head switch cells (e.g., GDHS cells 310-1 to 310-20) in a first power block (e.g., power block 202-1) and coupled to a global power supply rail (e.g., $VDD_{EXT}$). The circuit may selectively program the first plurality of head switch cells such that a first set of the first plurality of head switch cells (e.g., GDHS cells 310-1, 310-3, 310-5, 310-7, 310-9, 310-11, 310-13, 310-15, 310-17, and 310-19) is programmed on and a second set of the first plurality of head switch cells (e.g., GDHS cells 310-2, 310-4, 310-6, 310-8, 310-10, 310-12, 310-14, 310-16, 310-18, and 310-20) is programmed off. Each head switch cell includes a head switch (e.g., head switch 312) coupled between the global power supply rail and a power node (e.g., $VDD_{INT}$) for the head switch cell.

In some aspects, the operations 400 may further include, at optional block 404, selectively programming the first plurality of head switch cells such that a third set of the first plurality of head switch cells is programmed on and a fourth set of the first plurality of head switch cells is programmed off. The third set is different from the first set, and the fourth set is different from the second set.

In some aspects, the first plurality of head switch cells may be configured as a sequence register. In these aspects, the selectively programming in block 402 and/or optional block 404 may include sequentially programming the sequence register (i.e., sequentially programming the first plurality of head switch cells).

In some aspects, each head switch cell may further include an enable input (e.g., "ENABLE IN" in FIG. 3B) and a flip-flop (e.g., flip-flop 320) having a data input coupled to the enable input. Additionally, in some aspects, each head switch cell may further include a clock input (e.g., "CLOCK IN" in FIG. 3B), a clock output (e.g., "CLOCK OUT" in FIG. 3B), and a first logic gate (e.g., logic gate 316). The flip-flop may have a clock input coupled to the clock input of the head switch cell. The first logic gate may be coupled between the clock input of the head switch cell and the clock output of the head switch cell. Additionally, in some aspects, each head switch cell may further include an enable output ("ENABLE OUT" in FIG. 3B) and a second logic gate (e.g. logic gate 314) coupled between the enable input and the enable output.

In some aspects, (i) the enable output of a first head switch cell (e.g., GDHS cell 310-1) in the first plurality of head switch cells may be coupled to the enable input of a second head switch cell (e.g., GDHS cell 310-2) in the first plurality of head switch cells, and (ii) the clock output of the first head switch cell in the first plurality of head switch cells may be coupled to the clock input of the second head switch cell in the first plurality of head switch cells.

In some aspects, the operations 400 may further include programming a second plurality of head switch cells (e.g., GDHS cells 210) in a second power block (e.g., power block 202-2) and coupled to the global power supply rail to be programmed on or programmed off. Each head switch cell in the second plurality of head switch cells may include a head switch (e.g., head switch 212) coupled between the global power supply rail and a power node (e.g., $VDD_{INT}$) for the head switch cell. In these aspects, a single enable signal (e.g., Enable in FIG. 3A) may be configured to control all of the head switches in the second plurality of head switch cells.

In some aspects, the operations 400 may further include, at optional block 406, selectively programming a second plurality of head switch cells (e.g., GDHS cells 310-1 to 310-2) in a second power block (e.g., power block 202-2) and coupled to the global power supply rail such that a first set of the second plurality of head switch cells is programmed on (e.g., GDHS cells 310-1 to 310-7, 310-9 to 310-15, and 310-17 to 310-20) and a second set of the second plurality of head switch cells (e.g., GDHS cells 310-8 and 310-16) is programmed off, wherein each head switch cell in the second plurality of head switch cells comprises a head switch (e.g., head switch 312) coupled between the global power supply rail and a power node (e.g., $VDD_{INT}$) for the head switch cell.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. A circuit comprising:
    a global power supply rail; and
    a first power block comprising a first plurality of head switch cells coupled to the global power supply rail, wherein:
        each head switch cell comprises:
            a head switch coupled between the global power supply rail and a power node for the head switch cell;
            a clock input;
            a clock output;
            a flip-flop having a clock input coupled to the clock input of the head switch cell; and
            a first logic gate coupled between the clock input of the head switch cell and the clock output of the head switch cell; and
        the first plurality of head switch cells is configured such that a first set of the first plurality of head switch cells can be programmed on and a second set of the first plurality of head switch cells can be programmed off.

2. The circuit of claim 1, wherein the first plurality of head switch cells is configured as a sequence register.

3. The circuit of claim 1, wherein:
    each head switch cell further comprises an enable input; and
    the flip-flop further comprises a data input coupled to the enable input.

4. The circuit of claim 3, wherein each head switch cell further comprises:
    an enable output; and
    a second logic gate coupled between the enable input and the enable output.

5. The circuit of claim 4, wherein the first logic gate comprises a logic inverter and wherein the second logic gate comprises a logic buffer.

6. The circuit of claim 4, wherein:
    the enable output of a first head switch cell in the first plurality of head switch cells is coupled to the enable input of a second head switch cell in the first plurality of head switch cells; and
    the clock output of the first head switch cell in the first plurality of head switch cells is coupled to the clock input of the second head switch cell in the first plurality of head switch cells.

7. The circuit of claim 1, further comprising a second power block comprising a second plurality of head switch cells coupled to the global power supply rail, each head switch cell in the second plurality of head switch cells comprising a head switch coupled between the global power supply rail and a power node for the head switch cell, wherein the second plurality of head switch cells is configured such that at an instance:
    the head switches in the second plurality of head switch cells can be programmed on; or
    the head switches in the second plurality of head switch cells can be programmed off.

8. The circuit of claim 7, wherein a single enable signal is configured to control all of the head switches in the second plurality of head switch cells.

9. The circuit of claim 1, further comprising a second power block comprising a second plurality of head switch cells coupled to the global power supply rail, each head switch cell in the second plurality of head switch cells comprising a head switch coupled between the global power supply rail and a power node for the head switch cell, wherein the second plurality of head switch cells is configured such that a first set of the second plurality of head switch cells can be programmed on and a second set of the second plurality of head switch cells can be programmed off.

10. The circuit of claim 1, wherein the first plurality of head switch cells is dynamically programmable such that:
    at a first instance, the first set of the first plurality of head switch cells is configured to be on and the second set of the first plurality of head switch cells is configured to be off; and
    at a second instance, a third set of the first plurality of head switch cells is configured to be on and a fourth set of the first plurality of head switch cells is configured to be off, wherein the third set is different from the first set and wherein the fourth set is different from the second set.

11. A method of local power control, comprising:
    selectively programming a first plurality of head switch cells in a first power block and coupled to a global power supply rail such that a first set of the first plurality of head switch cells is programmed on and a second set of the first plurality of head switch cells is programmed off, wherein each head switch cell comprises:
        a head switch coupled between the global power supply rail and a power node for the head switch cell;
        a clock input;
        a clock output;
        a flip-flop having a clock input coupled to the clock input of the head switch cell; and
        a first logic gate coupled between the clock input of the head switch cell and the clock output of the head switch cell.

12. The method of claim 11, wherein the first plurality of head switch cells is configured as a sequence register and wherein the selectively programming comprises sequentially programming the sequence register.

13. The method of claim 11, wherein:
    each head switch cell further comprises an enable input; and
    the flip-flop further comprises a data input coupled to the enable input.

14. The method of claim 13, wherein each head switch cell further comprises:
    an enable output; and
    a second logic gate coupled between the enable input and the enable output.

15. The method of claim 14, wherein:
    the enable output of a first head switch cell in the first plurality of head switch cells is coupled to the enable input of a second head switch cell in the first plurality of head switch cells; and
    the clock output of the first head switch cell in the first plurality of head switch cells is coupled to the clock input of the second head switch cell in the first plurality of head switch cells.

16. The method of claim 11, further comprising programming a second plurality of head switch cells in a second power block and coupled to the global power supply rail to be programmed on or programmed off, wherein:

each head switch cell in the second plurality of head switch cells comprises a head switch coupled between the global power supply rail and a power node for the head switch cell; and a single enable signal is configured to control all of the head switches in the second plurality of head switch cells.

17. The method of claim 11, further comprising selectively programming a second plurality of head switch cells in a second power block and coupled to the global power supply rail such that a first set of the second plurality of head switch cells is programmed on and a second set of the second plurality of head switch cells is programmed off, wherein each head switch cell in the second plurality of head switch cells comprises a head switch coupled between the global power supply rail and a power node for the head switch cell.

18. The method of claim 11, further comprising selectively programming the first plurality of head switch cells such that a third set of the first plurality of head switch cells is programmed on and a fourth set of the first plurality of head switch cells is programmed off, wherein the third set is different from the first set and wherein the fourth set is different from the second set.

\* \* \* \* \*